(12) United States Patent
Sumiyoshi

(10) Patent No.: US 8,077,985 B2
(45) Date of Patent: Dec. 13, 2011

(54) DEVICE, METHOD, AND PROGRAM FOR COMPRESSING IMAGE DATA

(75) Inventor: Yasuaki Sumiyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 1234 days.

(21) Appl. No.: 11/391,313

(22) Filed: Mar. 29, 2006

(65) Prior Publication Data

US 2006/0222256 A1    Oct. 5, 2006

(30) Foreign Application Priority Data

Mar. 29, 2005  (JP) ................................. 2005-096223

(51) Int. Cl.
  *G06K 9/36* (2006.01)
  *G06K 9/46* (2006.01)
  *G06K 9/00* (2006.01)
(52) U.S. Cl. .................... 382/232; 382/239; 382/251
(58) Field of Classification Search .................. 382/232, 382/239, 251
  See application file for complete search history.

(56) References Cited

U.S. PATENT DOCUMENTS

| | | | | |
|---|---|---|---|---|
| 6,614,942 B1 * | 9/2003 | Meier | ............................ | 382/251 |
| 7,433,544 B2 * | 10/2008 | Lin et al. | ........................ | 382/299 |
| 2003/0086597 A1 * | 5/2003 | Ohta et al. | ..................... | 382/131 |
| 2004/0114199 A1 * | 6/2004 | Kanno | ............................ | 358/474 |
| 2005/0071579 A1 * | 3/2005 | Luick | .............................. | 711/154 |
| 2006/0221959 A1 * | 10/2006 | Sumiyoshi | .................... | 370/389 |

FOREIGN PATENT DOCUMENTS

| | | |
|---|---|---|
| JP | 09-130802 A | 5/1997 |
| JP | 2000-165874 A | 6/2000 |
| JP | 2003-281063 | 10/2003 |
| JP | 2003-288307 A | 10/2003 |
| JP | 2004-200893 A | 7/2004 |
| WO | WO 2004077357 A1 * | 9/2004 |

* cited by examiner

*Primary Examiner* — Bernard Krasnic
(74) *Attorney, Agent, or Firm* — Dickstein Shapiro LLP

(57) ABSTRACT

An image data compression device for rapidly compressing the file to a desired capacity is provided. The image data compression device comprising a compression target capacity value storage device for storing compression target capacity value defined in advance; a compression processing information storage device for storing information in the compression processing; a primary compression device for performing a prescribed compression processing on the image data to generate primary compressed image data, and storing the primary compression information representing a compression property during the compression processing in the compression processing information storage device; and a secondary compression device for compressing the primary compressed image data based on the primary compression information stored in the compression processing information storage device and the compression target capacity value stored in the compression target capacity storage device.

13 Claims, 9 Drawing Sheets

FIG. 3A

USER INFORMATION (ID : XXXX)

- USER NAME
- TELEPHONE NUMBER
- MAIL ADDRESS
- MODEL

- RECEIVABLE CAPACITY
- ATTACHABLE FILE NUMBER
- USABLE FORMAT

COMPRESSION PROCESSING INFORMATION
- ORIGINAL IMAGE INFORMATION (SIZE, CAPACITY)
- PRIMARY IMAGE INFORMATION
  (SIZE, CAPACITY, PRIMARY COMPRESSION RATIO)
- SECONDARY IMAGE INFORMATION
  (SIZE, CAPACITY, SECONDARY COMPRESSION RATIO)

FIG. 3C

FINE TUNING REFERENCE INFORMATION

| PRIMARY COMPRESSION RATIO | : | COMPRESSION PROCESSING CONTENT |
|---|---|---|
| 0.9 | : | Q(−10) ··· |
| 0.8 | : | ··· |
| 0.7 | : | ··· |
| ⋮ | | |
| 0.3 | : | −30% ··· |
| 0.0 | : | |

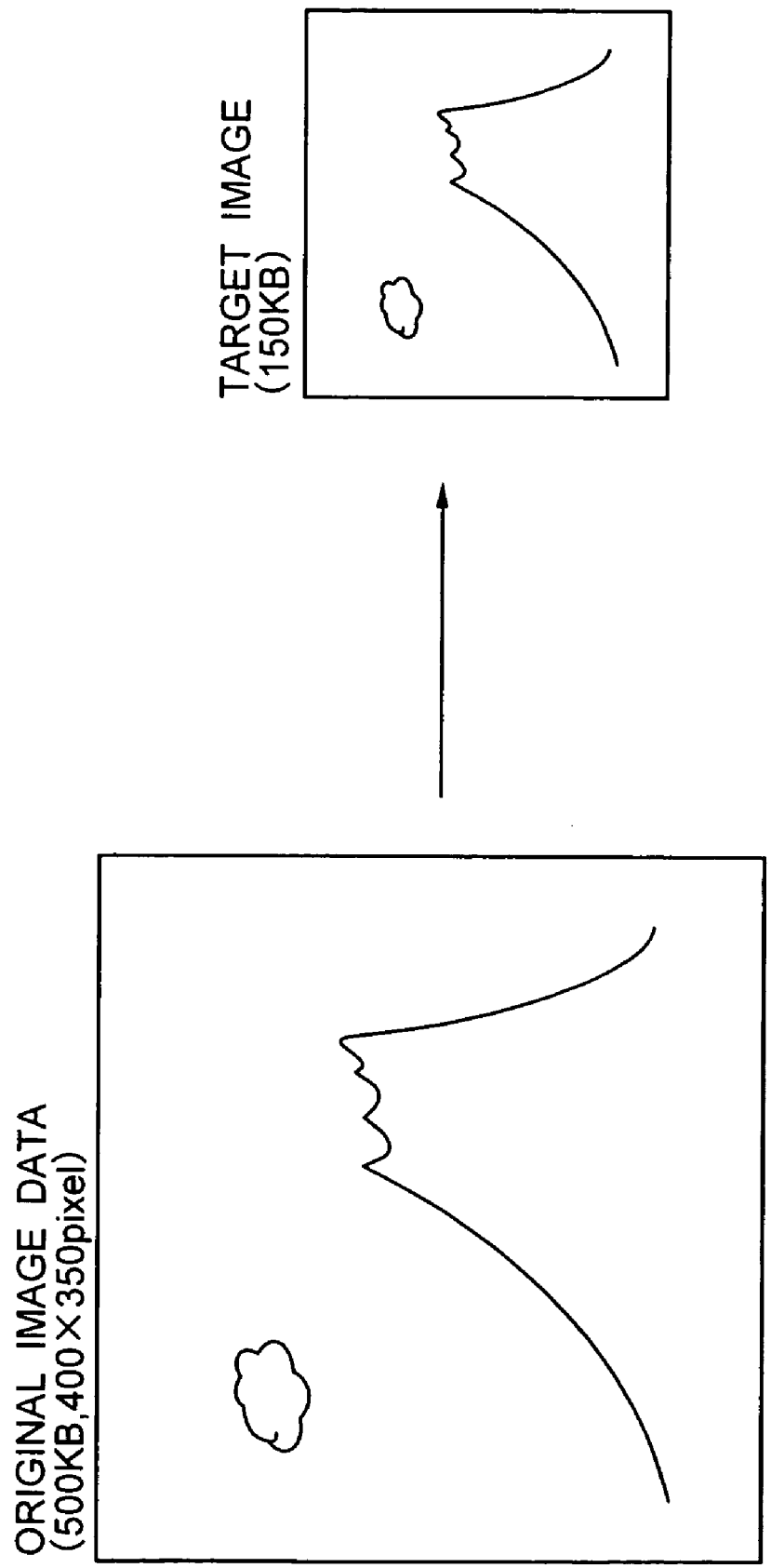

DEVICE, METHOD, AND PROGRAM FOR COMPRESSING IMAGE DATA

CROSS-REFERENCE TO RELATED APPLICATION

The present application claims priority to Japanese application No. 2005-096223, filed Mar. 29, 2005.

BACKGROUND OF THE INVENTION

1. Field of the Invention

The present invention relates to image data compression devices, more particularly, to an image data compression device for compressing the image data to lower than or equal to a prescribed capacity value.

2. Description of the Related Art

With advancement in recent network technology and the widespread use of personal computers and portable telephones, data communication, especially, data communication using electronic mails between terminals is being carried out on a daily basis. In addition to text data such as mail main text, various forms of files such as images, voices, video files and the like can be attached to the electronic mail, and such files can be transmitted to other terminals.

However, if the number of attached files is great and the capacity is large, there requires tremendous communication time and communication cost, which may impose excessive load on the network, server, and the receiver terminal as well. Further, other important electronic mails may not be received if such large capacity electronic mail is being received. Thus, an upper limit value is generally set to the data size of the file that can be received in electronic mail. Particularly, since the memory capacity of the telephone itself is extremely small in portable telephones, the capacity of the transmittable and receivable electronic mail is limited to be extremely small.

Therefore, reducing the data capacity of the file itself that is transmitted and received during communication is being considered, which technique is disclosed in the following Patent Literature. Japanese Laid-Open Patent Publication No. 2003-281063 (Patent Literature 1) discloses a technique of reducing the data size by compressing or deleting the image data attached to the electronic mail until the upper limit value is not exceeded when the data size of the electronic mail exceeds a prescribed upper limit value.

SUMMARY OF THE INVENTION

However, since the algorithm of the compression technology is complicating even if the file is compressed, as described above, prediction of the file capacity after compression becomes difficult, and the compressed file of a desired capacity cannot be obtained. Therefore, the compression processing must be repeated over a plurality of times in try and error in order to compress to the file capacity of close to the upper limit so as not to lower the quality of the file as much as possible. This increases the compression processing time and increases the load of the processing device. For instance, even if compression is performed based on the size of the image, such as resizing the image to a prescribed size when compressing the image data, the file of a desired capacity is difficult to obtain since the file capacity may not necessarily be in proportion to the compression ratio of the size.

The present invention, therefore, aims to provide an image data compression device capable of rapidly compressing the file to a desired capacity.

Therefore, the image data compression device according to one form of the present invention is an image data compression device for compressing a prescribed image data, which comprises:

a compression target capacity value storage device for storing a compression target capacity value defined in advance;

a compression processing information storage device for storing information at the time of compression processing;

a primary compression device for performing a prescribed compression processing on the image data to generate primary compressed image data, and storing the primary compression information representing compression property during the compression processing in the compression processing information storage device; and a secondary compression device for compressing the primary compressed image data based on the primary compression information stored in the compression processing information storage device and the compression target value stored in the compression target capacity storage device.

Particularly, the primary compression information is the compression ratio of a prescribed image property of the image data in the primary compression processing. The secondary compression device performs compression so that a ratio of a prescribed image property and the capacity ratio of before and after the secondary compression are equal. Specifically, the primary compression information is the compression ratio of an image size of the image data. The secondary compression device performs compression so that the surface area ratio and the capacity ratio of before and after the secondary compression are equal.

According to the present invention, a prescribed image compression is first performed and the compression property (e.g., compression property of an image property such as image size) thereat is stored. The compression property is the information representing the compression property corresponding to the property of the image data as it is acquired during the compression processing actually performed on the image data. The image data is thereafter compressed so as to meet the compression target value based on the compression property. For instance, the compression processing is performed so that the ratio of the image property such as the image size and the capacity ratio of before and after the secondary compression are equal. Therefore, an appropriate compression processing corresponding to the property of the image data is performed, and the compression result closer to the compression target value is obtained. Consequently, the repetition of the compression processing is suppressed, and the process is faster.

Further, the secondary compression device performs compression with a value lower than the compression target capacity value by a percentage set in advance as a target capacity value in the secondary compression. Since, the secondary compression processing is executed with a value further lower than the final compression target capacity value as the target, the image capacity after compression is more likely to meet the final compression target capacity, repetition of compression processing is suppressed, and the process is faster.

The image data compression device further comprises a fine tuning compression device for further performing compression when the capacity value of the image data after the secondary compression by the secondary compression device is larger than the compression target capacity value. At this time, a fine tuning compression reference information storage device for storing fine tuning compression reference information representing the compression content when performing the compression processing in the fine tuning compression device, set according to the primary compression information is provided, wherein the fine tuning compression device performs compression based on the fine tuning compression reference information.

Thus, compression is realized so as to more suitably meet the compression target capacity since the compression processing is performed based on the fine tuning compression reference information set in advance in accordance with the compression property of the image data.

The image data compression device further comprises a data transmission device for transmitting the image data to a terminal connected via the network. The compression target capacity value is an upper limit value of a receivable capacity of the image data at the terminal as the transmission target of the image data. When the image data is the data attached to the electronic mail, the image data compression device may be configured by a mail server for transferring the electronic mail between prescribed terminals.

Another form of the present invention is a program for a computer for compressing prescribed image data to execute a primary compression device for performing a prescribed compression processing on the image data to generate primary compressed image data and storing the primary compression information representing a compression property in the compression processing in a compression processing information storage device and a secondary compression device for compressing the primary compressed image data based on the primary compression information stored in the compression processing information storage device and a pre-defined compression target capacity value stored in a compression target capacity storage device.

The primary compression information is the compression ratio of a prescribed image property of the image data in the primary compression processing. The secondary compression device according to the program performs compression so that a ratio of a prescribed image property and a capacity ratio of before and after the secondary compression are equal. Further the secondary compression device performs compression with a value lower than the compression target capacity value by a percentage set in advance as a target capacity value in the secondary compression.

The program allows the computer to execute a fine tuning compression device for further performing compression when a capacity value of the image data after the secondary compression by the secondary compression device is larger than a compression target capacity value. The fine tuning compression device reads the fine tuning compression reference information representing the compression content when performing the compression processing in the fine tuning compression device set according to the primary compression information from the fine tuning compression reference storage device, and performs the compression based on the fine tuning compression reference information.

Another further form of the present invention is an image data compression method for compressing a prescribed image data using a computer, wherein the computer performs a prescribed compression processing on the image data to generate primary compressed image data and store the primary compression information representing the compression property in the compression processing in a compression processing information storage device; and compresses the primary compressed image data based on the primary compression information stored in the compression processing information storage device and the pre-defined compression target capacity value stored in the compression target capacity storage device.

The primary compression information is a compression ratio of a prescribed image property of the image data in the primary compression processing. The compression of the primary compressed image data in the method includes performing compression so that a ratio of a prescribed image property and a capacity ratio of before and after the secondary compression are equal. Further, the compression of the primary compressed image data includes performing compression with a value lower than the compression target capacity value by a percentage set in advance as the target capacity value in the secondary compression.

The method includes the computer to perform a fine tuning compression after the compression of the primary compressed image data when the capacity value of the image data is larger than the compression target capacity value. The fine tuning compression includes reading the fine tuning compression reference information representing the compression content when performing compression processing in the fine tuning compression set according to the primary compression information from the fine tuning compression reference information storage device and performing compression based on the fine tuning compression reference information.

The object of the present invention is also achieved with the invention of the program or the method of the above configuration as they operate similar to the above described image data compression device.

The present invention is configured and functions as above, where an appropriate compression processing corresponding to the property of the image data is performed and a compression result closer to the compression target value is obtained, and thus repetition of the compression processing is suppressed and the processing is faster, which are effects not obtained in the prior art.

BRIEF DESCRIPTION OF THE DRAWINGS

FIG. 3 is a view explaining the content of information stored in the mail server, where FIG. 3A shows user information, FIG. 3B shows compression processing information, and FIG. 3C shows fine tuning reference information;

FIG. 4 is an explanatory view showing a compression processing plan of the image data;

DETAILED DESCRIPTION OF THE PREFERRED EMBODIMENTS

The present invention has a feature of acquiring the compression property corresponding to the image data from the compression processing that has once been performed, and again performing compression so as to achieve the compression target value based on the acquired compression property. In the embodiment, the image data to be compressed is the image data attached to the electronic mail, and the image data compression device for compressing the image data is the mail server. It is to be noted that device, method, and program for compressing the image data of the present invention are not limited to being used as the mail server, and may be used in compressing any image data.

First Embodiment

Figure 1:
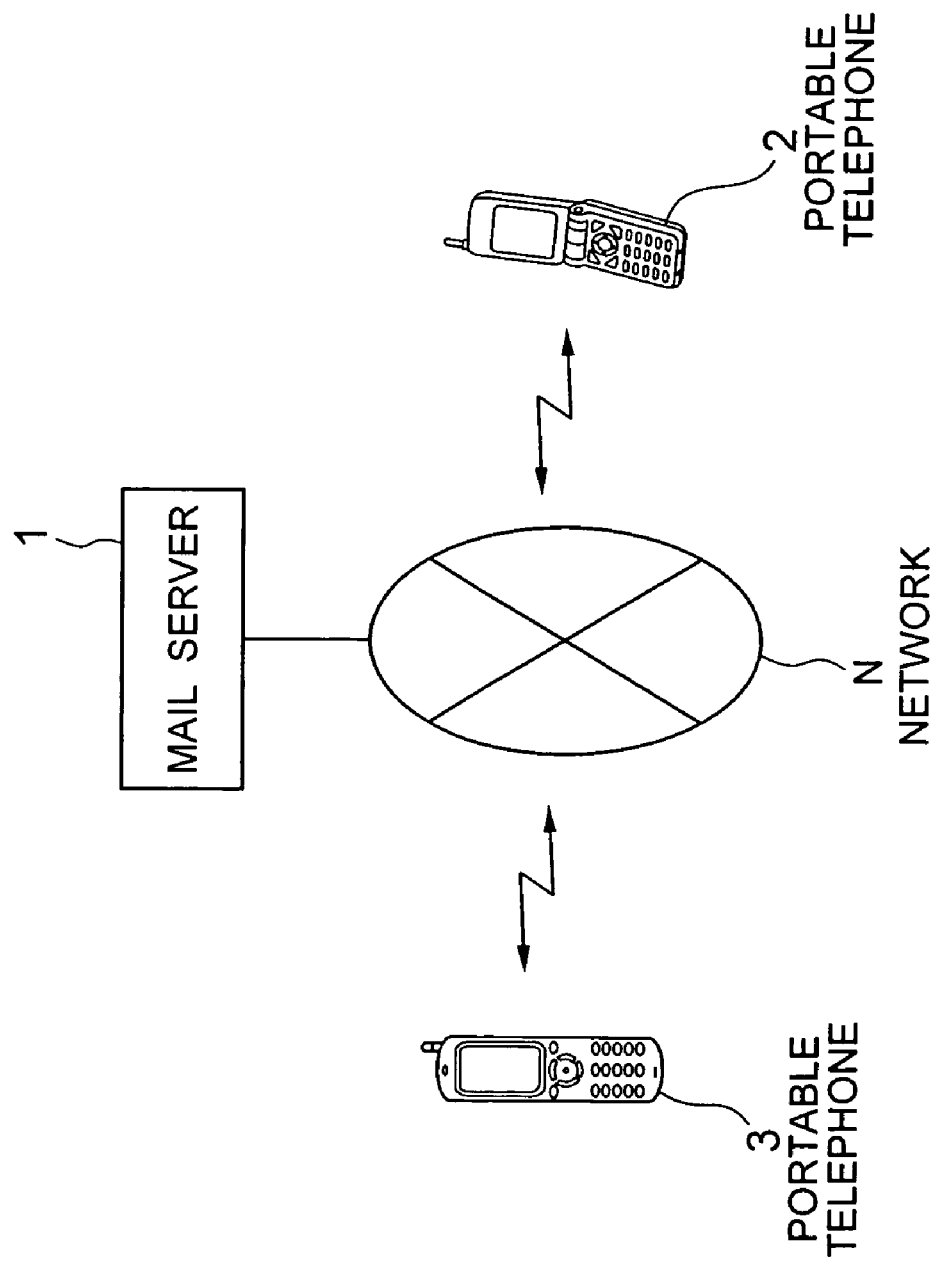
FIG. 1 is a schematic diagram showing an entire configuration of an embodiment of the present invention.
Figure 2:
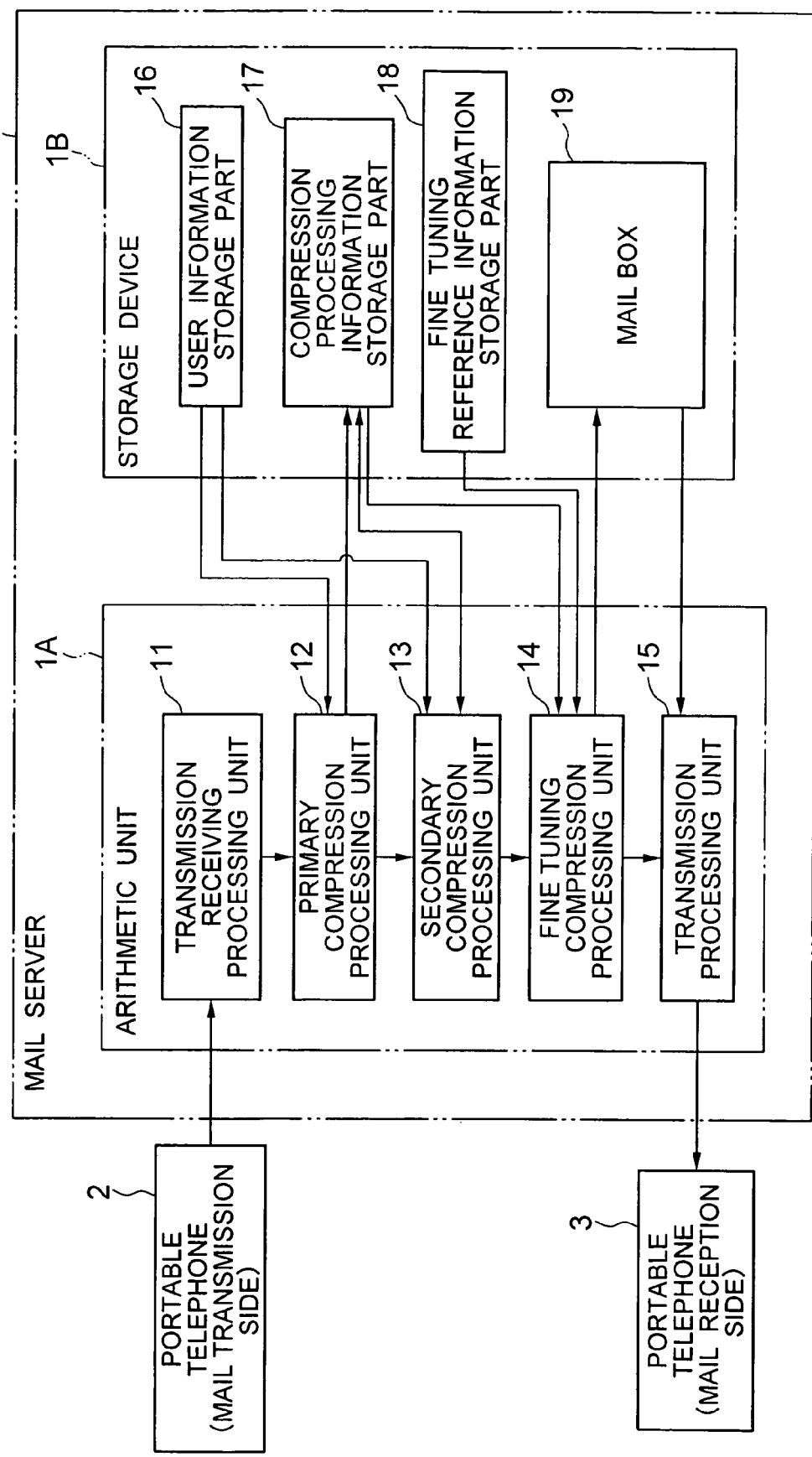
FIG. 2 is a functional block diagram showing a configuration of a mail server.
Figure 8:
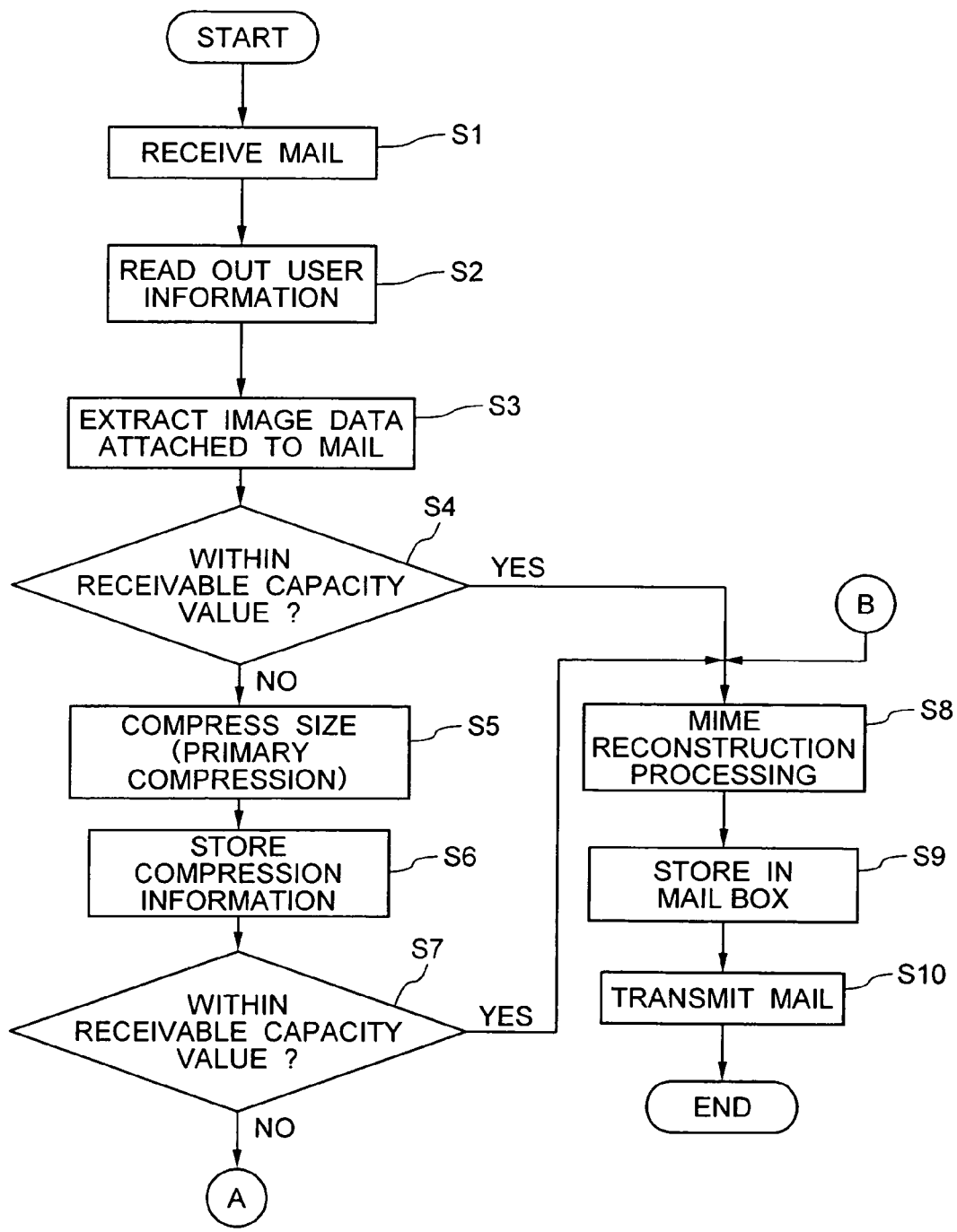
FIG. 8 is a flowchart showing an operation of a mail server.
Figure 9:
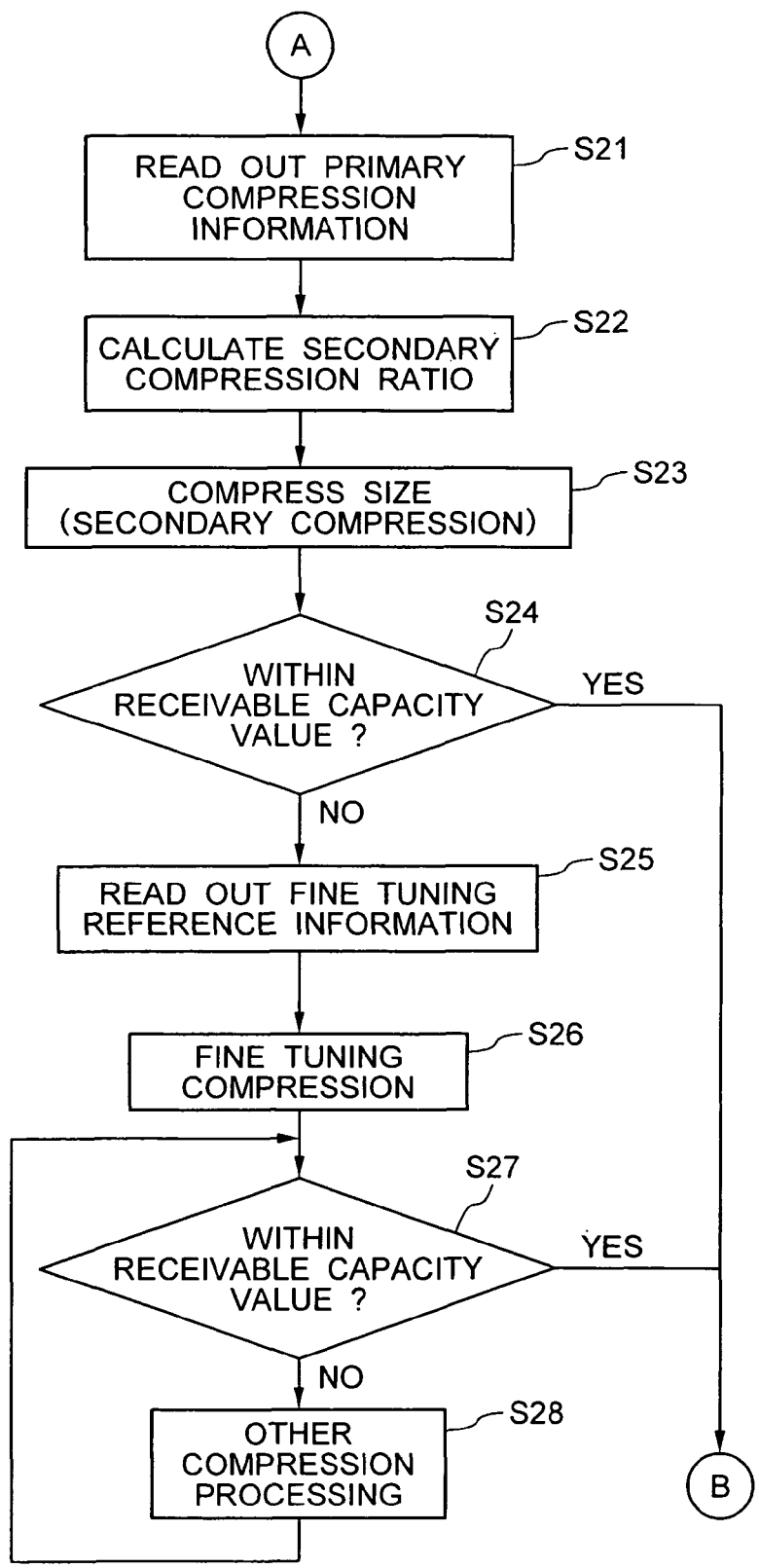
FIG. 9 is a flowchart showing the operation of the mail server.

A first embodiment of the present invention will now be described with reference to FIG. 1 to FIG. 9. FIG. 1 to FIG. 3 are views showing the configuration of the present invention, and FIG. 4 to FIG. 7 are explanatory views showing the state of the image data compression processing. FIG. 8 and FIG. 9 are flowcharts showing the operation.

[Constitution]

The image data compression device according to the embodiment of the present invention is configured by a mail server 1 for transferring the electronic mail between prescribed terminals. Thus, the mail server 1, arranged on the network N between portable telephones 2 and 3 for transmitting and receiving the electronic mail, as shown in FIG. 1, compresses the image data attached to the electronic mail and executes the transmitting processing. The mail server 1 may be configured with a gateway and the like arranged on the portable telephone network of each communication carrier connecting each portable telephone 2, 3.

The portable telephones 2 and 3 have a function of transmitting and receiving the electronic mail under a prescribed restriction. In the present embodiment, the portable telephone with reference numeral 2 is a transmission origin (mail transmission side) of the electronic mail and the portable telephone with reference numeral 3 is a transmission target (mail reception side) of the electronic mail. However, the terminal for transmitting and receiving the electronic mail is not limited to portable telephones 2 and 3, but may be information processing terminals connected to the network, such as a personal computer and PDA. The mail server 1 will be explained in detail hereinafter.

The configuration of the mail server 1 is shown in FIG. 2. The mail server 1 is a general computer server including an arithmetic unit 1A such as a CPU, a storage device 1B such as a hard disk, a communicating function and the like. The mail server 1 has a function serving as a general mail server of accepting the electronic mail from the transmission-origin portable telephone 2, storing it in the mail box of the receiver portable telephone 3, and transmitting it to the portable telephone 3 at a prescribed timing. In the present embodiment, a process of compressing the image data attached to the electronic mail to be transferred, in particular, is executed. In order to realize such compression processing, the mail server 1 adopts the following configuration.

A prescribed program (particularly, a program for image data compression) is installed in the arithmetic unit 1A of the mail server 1, and the arithmetic unit 1A is built to execute each function of a transmission receiving processing unit 11, a primary compression processing unit 12, a secondary compression processing unit 13, a fine tuning compression processing unit 14, and a transmission processing unit 15 by executing the program. Further, a user information storage part 16, a compression processing information storage part 17, a fine tuning compression reference information storage part 18, and a mail box 19 are formed in the storage device 1B. Each processing unit 11 to 15 and each storage part 16 to 19 will now be explained in detail.

FIG. 3 shows an example of information stored in the storage device 1B. FIG. 3A is an example of user information stored in the user information storage part 16 (user information storage device). These pieces of information is registered in advance to the carrier that manages the portable telephones 2 and 3, or it may be registered by the portable telephones 2 and 3 themselves through automatically transmitting the own terminal information every time communicating with the mail server 1. The user information carries information corresponding to the portable telephones 2 and 3, such as user name, telephone number, mail address, model of the portable telephone, as well as receivable capacity, attachable file number, and usable formats. The "receivable capacity" (receiving capacity upper limit value) is an upper limit value (for example, 1500 KB) of the receivable capacity for the portable telephone 3. This "receivable capacity" is the compression target capacity value of when compressing the image data attached to the electronic mail in the mail server 1, as hereinafter described in detail. Therefore, the user information storage part 16 functions as a compression target capacity value storage device. Other stored data will be briefly explained. The "attachable file number" (number of files) is the number (for example, four) of files that can be attached to the electronic mail. The "usable format" (format information) is the information indicating the format of the data file that can be used or cannot be used by the portable telephone (for example, information such as JPG, PNG, GIF for image data). The mail server 1 deletes the image data attached to the electronic mail that cannot be used at the portable telephone 3 of the mail reception side, performs format conversion processing and the like based on the relevant information.

FIG. 3B shows an example of the compression processing information stored in the compression processing information storage part 17 (compression processing information storage device). Information related to the image data attached to the electronic mail that is to be compressed is stored as the compression processing information. For instance, image information such as size and capacity of the original image data received from the portable telephone 2 on the mail transmission side, primary compression information representing the compression property such as the compression ratio during the primary compression processing to be hereinafter described, the size and capacity of the image after primary compression, and similarly, secondary compression information representing the compression property such as the compression ratio during the secondary compression processing, the size and capacity of the image after secondary compression and the like are stored.

FIG. 3C shows an example of the fine tuning reference information stored in the fine tuning reference information storage part 18 (fine tuning compression reference information storage device). The fine tuning reference information is the information representing the content of the compression processing referenced in the fine tuning compression processing, and is set according to the primary compression information. Specifically, the compression content set based on experimental result and theoretical calculation according to the compression ratio in the primary compression is described. The compression processing is performed in the fine tuning compression processing unit 14 to be hereinafter described based on such information.

Further, the mail box 19 secured in the storage device 1B is an area for storing the electronic mails that are transmitted to each portable telephone (user). In the embodiment, the electronic mail to be transmitted to the receiver-side portable telephone 3 is stored therein. The electronic mail is outputted from the mail box 19 to the portable telephone 3 at a prescribed timing.

Next, each of the processing unit 11-15 built in the arithmetic unit 1A will be described. First, the transmission receiving processing unit 11 receives the electronic mail transmitted from the portable telephone 2 as the mail transmission side, and gives it to the primary compression processing unit 12.

The primary compression processing unit 12 (primary compression device) extracts the image data attached to the electronic mail as the transmitted-data, executes a prescribed compression processing on the relevant image data, and generates the primary compressed image data. This compression processing is the processing of compressing the image data to a prescribed size, in the present embodiment. The target size of compression is contained in the user information and the like, and is the maximum size of the image data that can be viewed at the portable telephone 3 on the reception side. Alternatively, it is the size arbitrary set in the mail server 1.

The primary compression processing unit 12 stores the information of the primary compressed image data resulting from the primary compression, specifically, the size, the capacity, the compression ratio (primary compression information) in the compression processing information storing unit 17. The compression ratio in the present embodiment is the compression ratio of the image size. The information stored as the primary image information is not limited to the above described information, and may be the compression ratio of a different image property of the image data in the primary compression processing, and may also be the information representing other compression properties. For instance, the information may be the compression ratio of the color information of the image data.

If the primary compressed image data generated by the primary compression processing is within the receivable capacity, the primary compression processing unit 12 reattaches the image data to the electronic mail as it is so as to be transmitted to the portable telephone 3 on the reception side, and saves it in the mail box 19.

Figure 5:
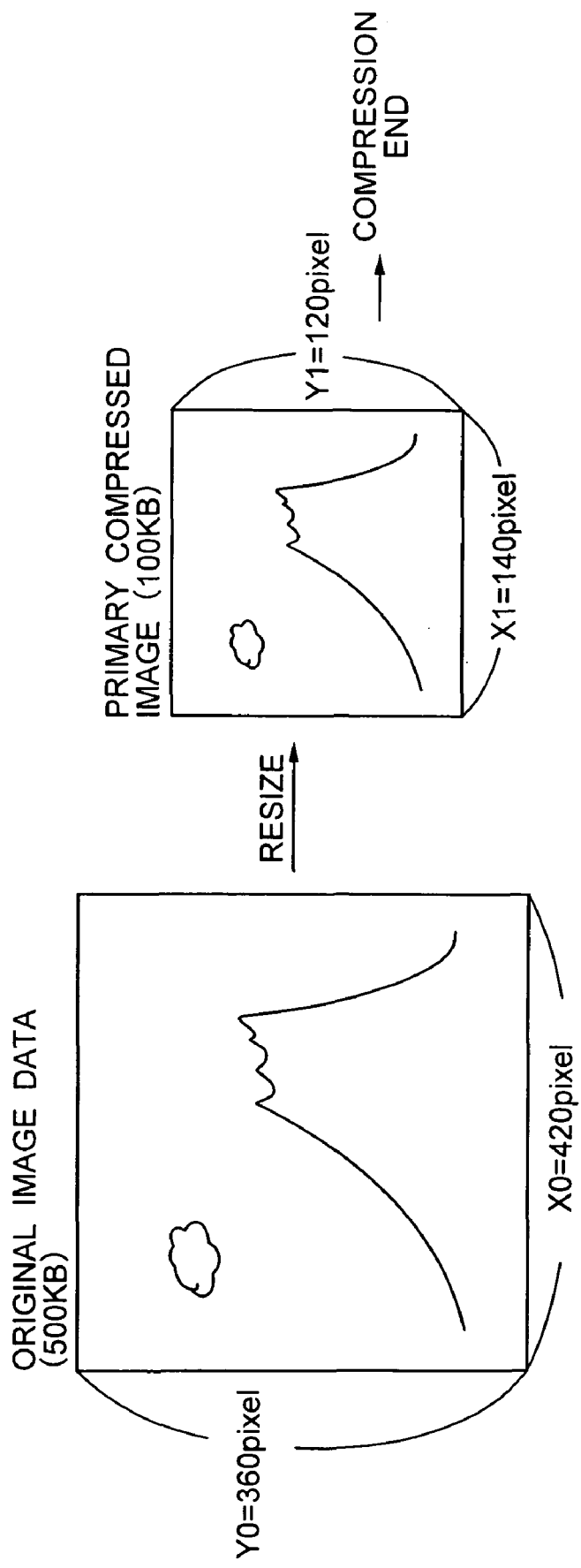
FIG. 5 is an explanatory view showing a state of the primary compression processing.
Figure 6:
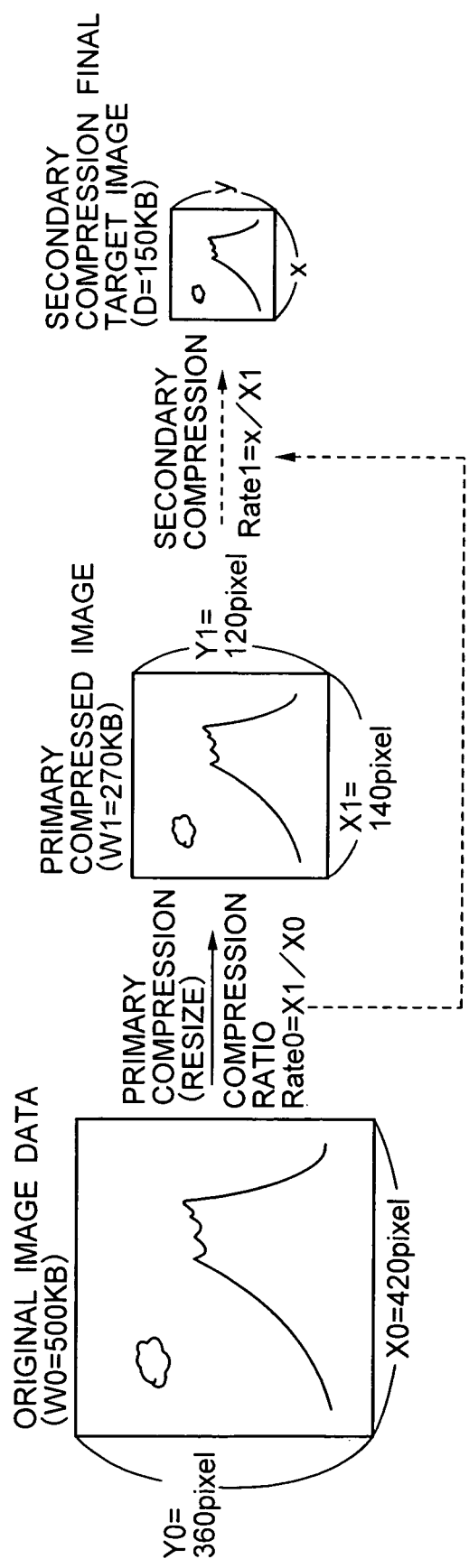
FIG. 6 is an explanatory view showing the state of the primary compression processing.

A specific example of the primary compression processing will now be explained with reference to FIG. 5 and FIG. 6. In this example, the original image data has a size of 420 pixels (XO) by 360 pixels (YO), and a capacity of 500 KB. The conversion (resizing) of the size by the primary compression is set to have the horizontal (XO) length that is to become the long side of 140 pixels. The compression rate "Rate 0" in such case can then be expressed as Rate $0=X1/X0$, as shown in FIG. 6. When the original image data is compressed at the compression ratio (Rate 0) of the size, the primary compressed image data after conversion has a size of 140 pixels (X1) by 120 pixels (Y1) and has a capacity of 100 KB for the example of FIG. 5, and 270 KB for the example of FIG. 6. Thus, the capacity after compression sometimes differs according to the property of the image even if the compression ratio of the size is the same. The compression information of the primary compressed image data is then stored in the compression processing information storage part 17. The example of FIG. 5 is an example of when the capacity of the image data becomes within the receivable capacity as a result of the primary compression, in which case, the primary compressed image data is not performed with the secondary compression processing, and is reattached to the electronic mail as it is so as to be transmitted to the portable telephone 3 on the reception side and saved in the mail box 19. In the example of FIG. 6, the secondary compression processing is performed on the primary compressed image data since the capacity is not within the receivable capacity.

The secondary compression processing unit 13 will now be explained. The secondary compression processing unit 13 (secondary compression device) performs compression processing on the primary compressed image data so as to be within the receivable capacity based on the compression ratio in the primary compression processing. Therefore, the secondary compression processing unit 13 calculates the compression ratio (secondary compression ratio) in the secondary compression processing.

The secondary compression ratio is, as described above, derived using the compression ratio (primary compression ratio) in the primary compression, specifically, derived using a ratio equation of (surface area ratio of image data)=(capacity ratio of image data) of before and after the secondary compression. More specifically, the length (e.g., horizontal width: x) of one side after the secondary compression is derived in the following manner.

$A0 = X0 \times Y0$ $Y0 = AR \times X0 (AR = Y0/X0$: aspect ratio)

$A1 = AR \times X1 \times X1 (A1$: image surface area after primary compression)

$A2 = AR \times X \times X (A2$: image surface area after secondary compression)

From the ratio equation of $A1:A2=W1:D$, $$x = \sqrt{\frac{A1 \times D}{AR \times W1}} \qquad \text{(Eq. 1)}$$

is obtained. Here, W1 is the image surface area after primary compression, and D is the final target image surface area.

Since equation 1 includes the compression ratio (X1/X0) in the primary compression, the secondary compression ratio calculated therefrom becomes the content reflecting the compression property of the image data.

The target capacity D of the image data is not the same as the receivable capacity and is preferably set to a value lower by a prescribed percentage. For instance, it is set to 95% of the receivable capacity. The horizontal length (x) is calculated with the capacity value slightly lower than the upper limit value of the target of compression as the target, and thus the image after compression processing is more likely to be within the receivable capacity. The value such as 95% is one example, and may be other percentages. The value may of course be the same value as the receivable capacity.

The horizontal length (x) of the secondary compressed image data as the compression target is thereby calculated. The compression ratio (rate $1=x/X1$) at which the horizontal length (X1) of the primary compressed image becomes the horizontal length (x) of the secondary compressed image data is calculated, and the secondary compressed image is executed based thereon.

Figure 7:
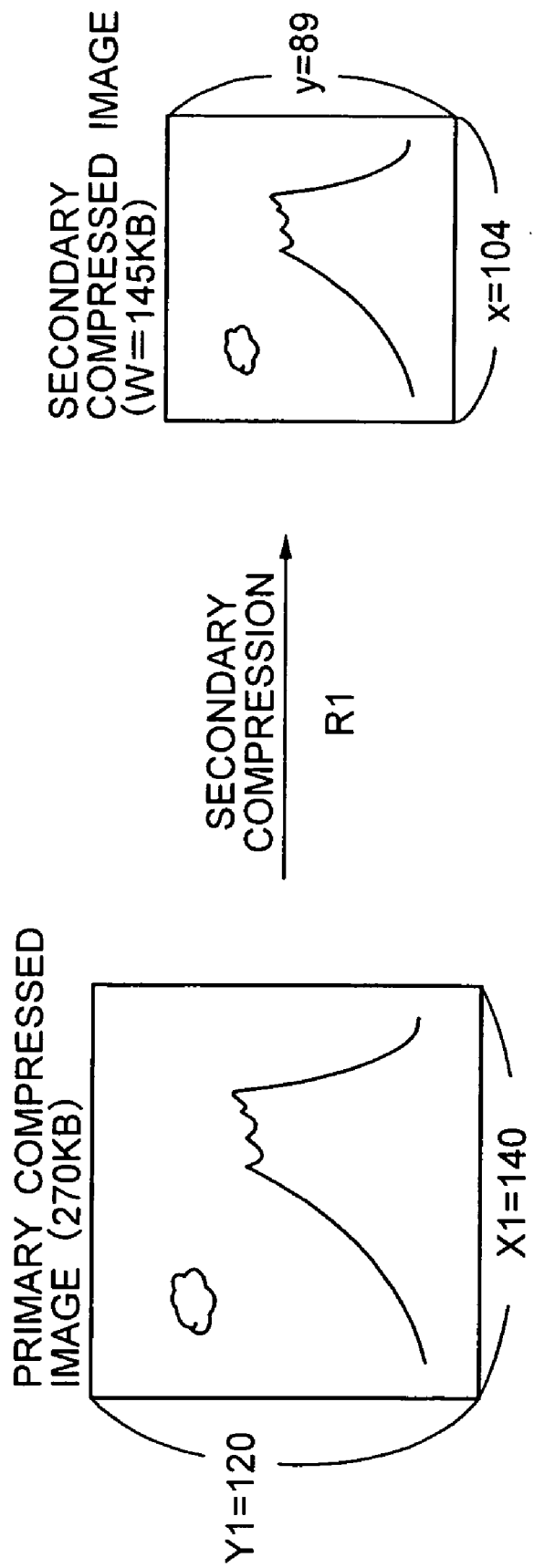
FIG. 7 is an explanatory view showing the state of a secondary compression processing.

One example of the secondary compression processing is shown in FIG. 7. When the secondary compression processing is performed, the secondary compressed image data after compression has a capacity w of 145 KB, which is within the receivable capacity D, as shown in the figure. Therefore, the image data is reattached to the electronic mail as it is so as to be transmitted to the portable telephone 3 on the reception side, and saved in the mail box 19. If the capacity is not within the receivable capacity even after the secondary compression processing, the image data is further sent to the fine tuning compression processing unit 14 where the fine tuning compression processing is further performed on the secondary compressed image data.

In the above description, the secondary compression ratio is calculated so as to satisfy the relationship (surface area ratio of image data)=(capacity ratio of image data), but is not necessarily limited thereto. The compression ratio may be derived so that the ratio of other properties of the image data becomes equal to the capacity ratio, and may be derived based on a different property.

The fine tuning compression processing unit 14 will now be explained. The fine tuning compression processing unit 14 (fine tuning compression device) executes the fine tuning compression processing on the secondary compressed image based on the fine tuning reference information as shown in FIG. 3C stored in the fine tuning reference information storage part 18, as described above.

The transmission processing unit 15 (data transmission device) transmits the electronic mail, destined for the portable telephone 3 on the reception side, stored in the mail box 19 to the portable telephone 3.

[Operation]

The operation of the mail server 1 of the above configuration will now be described with reference to the flowcharts of FIG. 8 and FIG. 9. The state of compression of the image data will be simultaneously explained with reference to FIG. 4 to FIG. 7.

First, the portable telephone 2 on the mail transmission side creates an electronic mail for the portable telephone 3 on the reception side. This electronic mail is attached with the image data shown on the left side of FIG. 4. The electronic mail attached with the image data is transmitted via the network N and received at the mail server 1 of the portable telephone 3 on the reception side (step S1). The mail server 1 specifies the destination of the received electronic mail, that is, the portable telephone 3 on the reception side, and reads the user information of the portable telephone 3 on the reception side from the user information storage part 16 (step S2). Particularly, the "receivable capacity" of the portable telephone 3 is read among the user information. The read "receivable capacity" becomes the capacity of the target image after compression. The compression processing is performed as described below so that the capacity of the attached image data becomes less than or equal to 150 KB, as shown on the right side of FIG. 4.

Subsequently, the image data attached to the electronic mail is extracted (step S3). This image data becomes the target of compression, which is compressed with a target of being less than or equal to 150 KB as the receivable capacity. The original image data attached to the electronic mail has a size of 420 pixels (X0) by 360 pixels (Y0) and has a capacity of 500 KB, as shown on the left side of FIG. 5. Determination is made on whether or not the capacity of the original image data is less than or equal to the receivable capacity (step S4). If the capacity is already less than or equal to the receivable capacity, MIME reconstruction processing is performed (step S8), and then stored in the mail box 19 as the electronic mail that can be transmitted to the portable telephone 3 on the reception side (step S9). The electronic mail is transmitted to the portable telephone 3 at the request of retrieval of mail from the portable telephone 3 on the reception side or at a constant timing of the transmitting processing and the like of the mail server 1 (step S10).

In the example shown in FIG. 5, the primary compression processing (step S5) as a process of compressing to a prescribed image size is performed since the capacity of the original image data is not less than or equal to the receivable capacity (No in step S4). Specifically, since the conversion (resizing) of the size by the primary compression is set to have the horizontal (X0) length that is to become the long length of 140 pixels, the primary compression ratio "Rate 0=X1/X0" can be calculated, and compression processing is performed.

The primary compressed image data after conversion is generated, which primary compressed image data has a size converted to 140 pixels (X1) by 120 pixels (Y1) (refer to primary compressed image data of FIG. 5, FIG. 6). The compression information at this state is stored in the compression processing information storage part 17 (step S6). The capacity becomes 100 KB in the example shown in FIG. 5, which is less than or equal to the receivable capacity (150 KB) (YES in step S7), and thus the compression processing is terminated. Thereafter, the process proceeds to the mail transmission processing (step S8 to step S10), similar to above. The capacity becomes 270 KB in the example shown in FIG. 6, which is still not within the receivable capacity (150 KB) (NO in step S7), and thus the primary compressed image data is performed with the secondary compression processing (proceed to reference character A (FIG. 9)).

Subsequently, the primary compression information, that is, the size, the capacity, the primary compression ratio, and the target image capacity value (receivable capacity) of the primary compressed image stored in the compression processing information storage part 17 is read (step S21), and the secondary compression ratio is calculated (step S22). Specifically, the length of one side of the image after the secondary compression is calculated using the ratio equation (surface area ratio of image data)=(capacity ratio of image data) of before and after the secondary compression, as described above, and the compression ratio is calculated based thereon (refer to FIG. 6).

The size compression processing (secondary compression processing) is performed on the primary compressed image data based on the compression ratio (step S23). In the example shown in FIG. 7, for example, the secondary compressed image data after compression has a capacity w of 145 KB, which is within the receivable capacity D (150 KB) (YES in step S24). Therefore, the image data is reattached to the electronic mail as it is so as to be transmitted to the portable telephone 3 on the reception side, and saved in the mail box 19 (steps S8 to S10 of FIG. 8). If the capacity of the image data is still not within the receivable capacity after the secondary compression processing (NO in step S24), fine tuning compression processing is further performed on the secondary compressed image data.

In the fine tuning compression processing, the fine tuning reference information as shown in FIG. 3C stored in the fine tuning reference information storage part 18 is read (step S25), the fine tuning reference information corresponding to the compression ratio in the primary compression is specified, and the fine tuning compression processing is performed on the secondary compressed image data based on the compression content indicated therein (step S26). Determination is made on whether or not the capacity of the image data after the compression processing is within the receivable capacity (step S27), and if within the receivable capacity (YES in step S27), the image data is reattached to the electronic mail as it is so as to be transmitted to the portable telephone 3 on the reception side and saved in the mail box 19 (steps S8 to S10 of FIG. 8). If the capacity of the image data is still not within the receivable capacity even after the fine tuning compression processing (NO in step S27), a prescribed compression processing such as reduction of size is performed (step S28), and the compression processing is repeated until the capacity of the image data becomes within the receivable capacity.

Therefore, since the electronic mail attached with the image data compressed to the capacity that can be received at the portable telephone 3 is transmitted to the portable telephone 3 on the mail reception side, the electronic mail is reliably received, and the image data can be viewed. Since the image data is compressed so as to substantially meet the compression target value as the receivable capacity of the portable telephone 3 on the reception side through the two compression processes in the mail server 1, the repetition of the compression processing is suppressed, the mail transmission process is faster, and the processing load on the mail server 1 is reduced.

The image data compression device of the present invention is utilized as the mail server for executing the compression processing on the image data attached to the electronic mail and has industrial applicability.

What is claimed is:

1. An image data compression device for compressing input image data, the input image data targeted to be compressed being rectangle-shaped image data having a length of X0 in a long side and a length of Y0 in a short side, the device comprising:
    a compression target capacity value storage device for storing a compression target capacity value D defined in advance;
    a compression processing information storage device for storing information in the compression processing;
    a primary compression device for resizing the input image data by reducing the X0 and Y0 lengths to a size defined in advance to generate primary compression image data, and storing primary compression information showing an image surface area A1 and an image capacity W1 of the primary compression image data in the compression processing information storage device; and
    a secondary compression device for compressing the primary compression image data to generate secondary compression image data by calculating a length x of a long side of the secondary compression image data by applying the image surface area A1 and the image capacity W1 of the primary compression image data, and an aspect ratio AR (Y0/X0) of the input image data targeted to be compressed into the following expression:

$$x=\sqrt{((A1 \cdot D)/(AR \cdot W1))};$$

wherein the image surface area A1 of the primary compression image data is larger than an image surface area of the secondary compression image data.

2. The image data compression device as claimed in claim 1, wherein the secondary compression device performs compression with a value lower than the compression target capacity value by a percentage set in advance as a target capacity value in the secondary compression.

3. The image data compression device as claimed in claim 1, further comprising a fine tuning compression device for further performing compression when the capacity value of the image data after the secondary compression by the secondary compression device is larger than the compression target capacity value.

4. The image data compression device as claimed in claim 3, further comprising a fine tuning compression reference information storage device for storing fine tuning compression reference information representing the compression content when performing the compression processing in the fine tuning compression device set according to the primary compression information, wherein the fine tuning compression device performs compression based on the fine tuning compression reference information.

5. The image data compression device as claimed in claim 1, wherein the compression target capacity value is an upper limit value of a receivable capacity of image data at a terminal as a transmission target of the image data.

6. A non-transitory computer-readable storage medium containing a program for compressing input image data, the input image data targeted to be compressed being rectangle-shaped image data having a length of X0 in a long side and a length of Y0 in a short side, which when loaded into a memory and run by a computer, causes the computer to execute:
    resizing of the input image data by reducing the X0 and Y0 lengths to a size defined in advance to generate primary compression image data and primary compression information showing an image surface area A1 and an image capacity W1 of the primary compression image data; and
    compressing the primary compression image data to generate secondary compression image data by calculating a length x of a long side of the secondary compression image data by applying the image surface area A1 and the image capacity W1 of the primary compression image data, and an aspect ratio AR (Y0/X0) of the input image data targeted to be compressed into the following expression:

$$x=\sqrt{((A1 \cdot D)/(AR \cdot W1))},$$

wherein D is a compression target capacity value of the secondary compression image data;
    wherein the image surface area A1 of the primary compression image data is larger than an image surface area of the secondary compression image data.

7. The non-transitory computer-readable storage medium as claimed in claim 6, wherein the secondary compression is performed with a value lower than the compression target capacity value by a percentage set in advance as a target capacity value.

8. The non-transitory computer-readable storage medium as claimed in claim 6, wherein the computer further executes a fine tuning compression when the capacity value of the image data after secondary compression is larger than the compression target capacity value.

9. The non-transitory computer-readable storage medium as claimed in claim 8, wherein the fine tuning compression is executed based on fine tuning compression reference information set according to the primary compression information.

10. A method of compressing image data, the method comprising:
    using rectangle-shaped input image data having a length of X0 in a long side and a length of Y0 in a short side as image data targeted to be compressed;
    resizing the input image data by reducing the X0 and Y0 lengths to a size defined in advance to generate primary compression image data and primary compression information showing an image surface area A1 and an image capacity W1 of the primary compression image data; and
    compressing the primary compression image data to generate secondary compression image data by calculating a length x of a long side of the secondary compression image data by applying the image surface area A1 and the image capacity W1 of the primary compression image data, and an aspect ratio AR (Y0/X0) of the input image data targeted to be compressed into the following expression:

$$x=\sqrt{((A1 \cdot D)/(AR \cdot W1))},$$

wherein D is a compression target capacity value of the secondary compression image data;

wherein the image surface area A1 of the primary compression image data is larger than an image surface area of the secondary compression image data.

11. The method of compressing image data as claimed in claim 10, wherein the secondary compression is performed with a value lower than the compression target capacity value by a percentage set in advance as a target capacity value when compressing the primary compressed image data.

12. The method of compressing image data as claimed in claim 10, wherein fine tuning compression is further performed after compression of the primary compressed image data when the capacity value of the image data after compression of the primary compressed image data is larger than the compression target capacity value.

13. The method of compressing image data as claimed in claim 12, wherein the fine tuning compression is performed based on fine tuning compression reference information set according to the primary compression information.

\* \* \* \* \*